(12) United States Patent
Cheung et al.

(10) Patent No.: US 6,552,572 B1
(45) Date of Patent: Apr. 22, 2003

(54) CLOCK GATING CELL FOR USE IN A CELL LIBRARY

(75) Inventors: Cyrus C. Cheung, Hercules, CA (US); Keith D. Au, Woodland Hills, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/999,726

(22) Filed: Oct. 24, 2001

(51) Int. Cl.[7] .............................................. H03K 19/00

(52) U.S. Cl. ............................ 326/93; 326/37; 326/101

(58) Field of Search .............................. 326/37, 47, 38, 326/93, 101; 716/1, 2, 3, 6

(56) References Cited

U.S. PATENT DOCUMENTS 6,318,911 B1 * 11/2001 Kitahara ................ 395/500.07

* cited by examiner

Primary Examiner—Michael Tokar
Assistant Examiner—Anh Tran
(74) Attorney, Agent, or Firm—Hitt Gaines & Boisbrun, P.C.

(57) ABSTRACT

A clock gating cell and a method of manufacturing the same. In one embodiment, the clock gating cell includes: (1) gate signal and clock signal inputs configured to receive gate enable and clock input signals, respectively, and (2) a gated clock signal output configured to generate a gated clock signal that is a function of states of the gate enable and clock signals, the clock gating cell treated as an atomic entity in a cell library.

18 Claims, 2 Drawing Sheets

CLOCK GATING CELL FOR USE IN A CELL LIBRARY

TECHNICAL FIELD OF THE INVENTION

The present invention is directed, in general, to a gated clock, and more specifically, to an "atomic" gated clock cell.

BACKGROUND OF THE INVENTION

A cell is a group of one or more circuit elements such as transistors, capacitors, and other basic circuit elements grouped to perform a function. Cell placement in semiconductor fabrication involves determining placement of particular cells on the surface of an integrated circuit, such as an application-specific integrated circuit (ASIC). Cell placement is one of the steps necessary for the fabrication of the ASIC. The ASIC has cells and connections between the cells, formed on a surface of a semiconductor substrate. The ASIC may include a large number of cells and require complex connections between the cells.

Due to the large number of components and the exacting details required by the fabrication process, a physical design of the ASIC is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

However, the ASIC may have a large number, which can be tens of thousands, hundreds of thousands or even millions or more of small cells. Each cell represents a single logic element, such as a gate, or several logic elements interconnected in a standardized manner to perform a specific function. Cells are often arranged into cell libraries to facilitate their repeated use.

One goal of cell placement is to find a minimum area arrangement for the cells that allows completion of interconnections between the cells. Placement is typically done in two phases. In the first phase, an initial placement is created. In the second phase, the initial placement is evaluated and iterative improvements are made until the layout has minimum area and conforms to design specifications.

One such functionality that may be desired from the interactions and interconnections of the cells is that of forming a gated clock. A gated clock may generally be defined as a clock that generates a clock pulse that is substantially synchronous to a source clock signal when a gating signal is also asserted. The source clock signal is generally propagated throughout an ASIC in what is colloqially known as a "clock tree." A gated clock may consist of a latch, perhaps an active low latch, and an AND gate.

In the ASIC world, a clock gating module is usually made up of two standard cells, such as an AND gate and a latch, which should ideally be placed very close to each other in the layout. A problem arose in the prior art when a cell placement tool placed clock gating modules far apart or sourced clock gating modules from different branches of the clock tree (a risk realized when clock gating modules are tied to different ASIC pins). Any resulting clock skew or propagation delay in the gating signal between the latch and the gate can cause a "race condition" for the AND gate. An unwanted glitch can occur as a result of such race condition. The unwanted glitch may manifest as an additional undesired positive gated pulse, for instance. This problem is particularly annoying when there are a number of gated clocks in an ASIC design. To remedy this misplacement of the cells, the ASIC designer has been required manually to move the AND gate cell and the latch cell closer together.

For more information about cells, please see U.S. Pat. No. 6,243,849B1 to Singh, et al., which is hereby incorporated by reference in its entirety. Also for more information about clocks, please see U.S. Pat. No. 6,246,278B1 to Anderson, et al., which is hereby incorporated by reference in its entirety.

Accordingly, what is needed in the art is a gated clock that overcomes the limitations of the prior art. What is also needed is such gated clock that is employable as an atomic cell in a cell library.

SUMMARY OF THE INVENTION

To address the above-discussed deficiencies of the prior art, the present invention provides a clock gating cell and a method of manufacturing the same. In one embodiment, the clock gating cell includes: (1) gate signal and clock signal inputs configured to receive gate enable and clock input signals, respectively, and (2) a gated clock signal output configured to generate a gated clock signal that is a function of states of the gate enable and clock signals, the clock gating cell treated as an atomic entity in a cell library.

The present invention therefore introduces the concept of a unitary ("atomic") clock gating cell that is to be handled as an inseparable, indivisible entity in a cell library, thereby ensuring its proper operation. The present invention enjoys substantial utility in that it avoids race conditions that may otherwise occur when clock gating circuitry is divided between two or more cells.

Prior art clock gating circuits were not defined as a single cell and therefore risked being separated during compiling or being tied to different branches of a clock tree. Unfortunately, designers of such circuits were not motivated to recast such circuits as atomic entities, because separation did not always occur, and the risk was therefore unappreciated. Further, such separate circuits contained no motivation or suggestion that they could be recast as atomic entities.

In one embodiment of the present invention, internal circuitry of the clock gating cell comprises a latch configured to receive the gate enable and clock input signals and generate therefrom a latch enable signal. In an embodiment to be illustrated and described, the clock input signal is passed through a transparent low latch.

In one embodiment of the present invention, internal circuitry of the clock gating cell comprises combinatorial logic that generates the gated clock signal directly from the clock signal. In a more specific embodiment, the internal circuitry further comprises combinatorial logic that generates the gated clock signal from the latch enable and the clock input signal. In an embodiment to be illustrated and described, the combinatorial logic comprises an AND gate.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
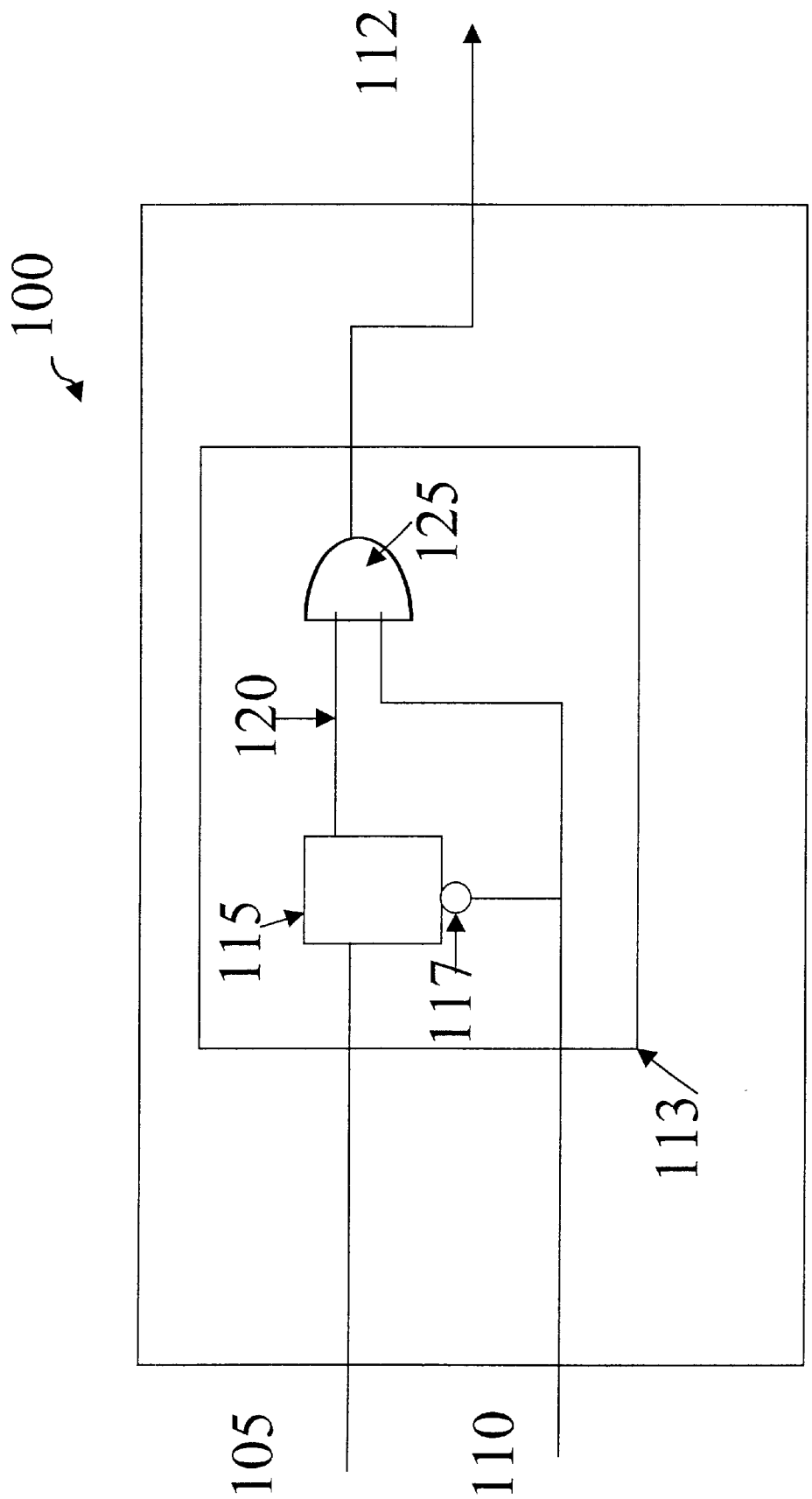
FIG. 1 illustrates one embodiment of a unitary "atomic" clock gating cell built according to the principles of the present invention.

Referring initially to FIG. 1, disclosed is one embodiment of a unitary "atomic" (i.e., indivisible) clock gating cell 100 built according to the principles of the present invention. A silicon compiler treats the unitary clock gating cell 100 as an atomic entity. A silicon compiler may be generally defined as a computer program that generates IC layouts, such as application-specific integrated circuit (ASIC) layouts, from a high-level specification. One example of employing the unitary clock gating cell 100 as an atomic entity by the silicon compiler is during the design and implementation of the ASIC.

The unitary clock gating cell 100 has a gate enable input 105 and a clock signal input 110 configured to receive gate and clock input signals, respectively. The unitary clock gating cell 100 also has a gated clock signal output 112 that is configured to generate a gated clock signal as a function of states of the gate enable 105 and the clock signal 110. The unitary clock gating cell 100 is a cell such as may be employed in the design of an ASIC.

The clock gating cell 100, although treated as an indivisible and atomic entity by the silicon compiler which creates the ASIC, has an internal circuitry 113. The internal circuitry 113 has a latch 115, such as transparent low latch, although other latches (such as falling edge latches) are well within the scope of the present invention. The latch 115 also has an inverter 117, which inverts a high clock input signal 110 to low, and a low clock input signal 110 to high. The latch 115 allows the gate enable signal 105 to pass through the latch 115 to a latch enable signal 120 when the latch is enabled (i.e, due to the inverter 117, when the clock input signal is low), but the latch 115 freezes the latch enable signal 120 at its last output value when the latch 115 is disabled (i.e, due to the inverter 117, when the clock input signal is high.)

The internal circuitry 113 also has an AND gate 125. The AND gate 125 is a source within the internal circuitry 113, and ultimately a source of the clock gating cell 100, of the gated clock signal output 112. The AND gate 125 combines the latch enable signal 120 and the clock input signal 110. This combinatorial logic, of combining within the AND gate 125 the clock input signal 110 and the latch enable signal 120, generates the gated clock signal 112 directly from the clock input signal 110. In a further embodiment, the combinatorial logic within the AND gate 125 generates the gated clock signal 112 from the latch enable signal 120 and the clock input signal 115.

Figure 2:
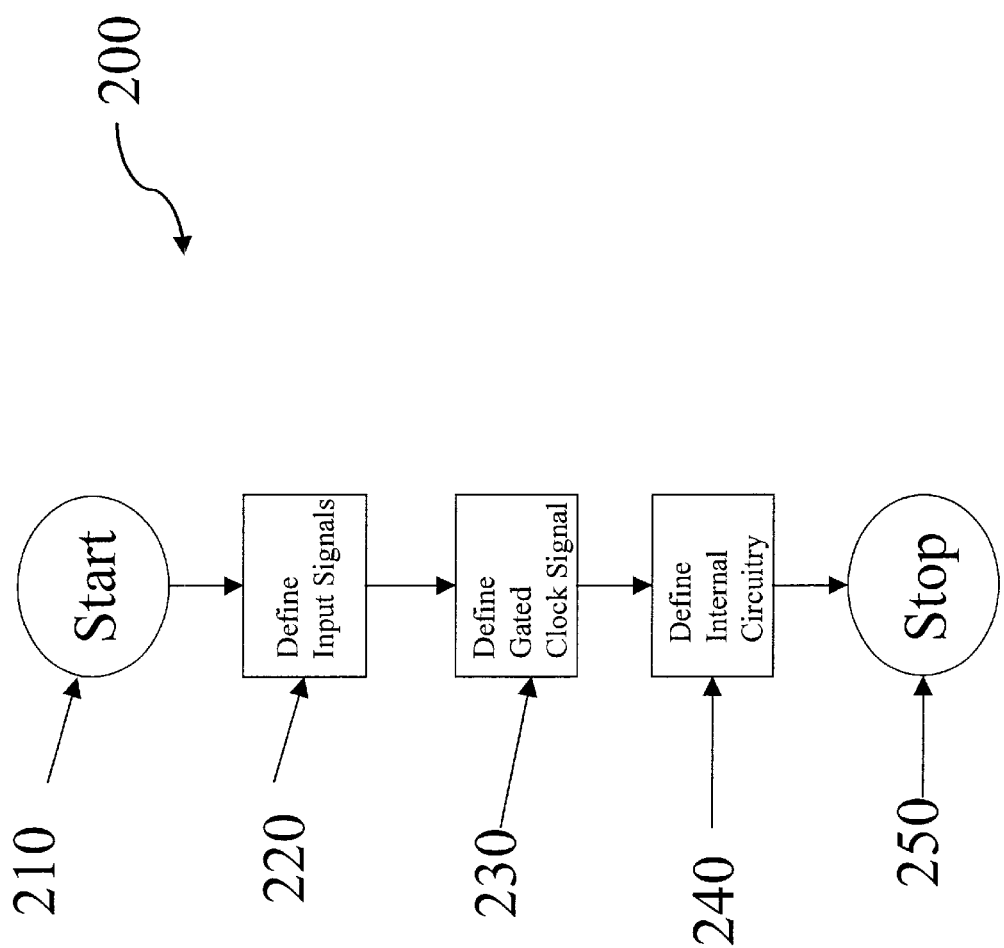
FIG. 2 illustrates a method of manufacturing a unitary "atomic" clock gating cell according to the principles of the present invention.

Turning now to FIG. 2, disclosed is a method of manufacturing 200 the clock gating cell 100 according to the principles of the present invention. After executing a step start 210, the silicon compiler then defines the unitary "atomic" clock gating cell 100 as having the gate input signal 105 and the clock input signal 110 in a step 220.

After the step 220, the silicon compiler then defines the gated clock signal 112 output configured to generate a gated clock signal that is a function of states of the gate enable signal 120 and the input clock signal 110 in a step 230. At all times, the clock gating cell 100 is treated as an atomic entity by the silicon compiler.

After the step 230, the silicon compiler then defines the internal circuitry 113 of the unitary clock gating cell 100 in a step 240. The step 240 creates the internal circuitry 113 having a latch configured to receive the gate enable signal 120 and clock input signal 110 to generate therefrom the latch enable signal 120. The clock input signal 110 is provided to the latch 115. The latch 115 may be a transparent low latch, although other latches (such as falling edge latches) are well within the principles of the present invention. The combinational logic of the internal circuitry 113 will also have defined an AND gate 125. The internal circuitry 113 also has combinatorial logic that generated the gated clock signal 112 directly from the input clock signal 110. The internal circuitry 113 also generates the gated clock 112 signal from the combination of the latch enable circuit 120 and the input signal 110.

Finally, after the silicon compiler has performed the above steps in defining a unitary "atomic" gating clock 100 in the method of manufacturing 200, the silicon compiler executes a stop step 250.

Although the present invention has been described in detail, those skilled in the art should understand that they can make various changes, substitutions and alterations herein without departing from the spirit and scope of the invention in its broadest form.

What is claimed is:

1. A clock gating cell, comprising:
   gate signal and clock signal inputs configured to receive gate enable and clock input signals, respectively; and
   a gated clock signal output configured to generate a gated clock signal that is a function of states of said gate enable and clock signals, said clock gating cell treated as an atomic entity in a cell library.

2. The clock gating cell as recited in claim 1 wherein internal circuitry of said clock gating cell comprises a latch configured to receive said gate enable and clock input signals and generate therefrom a latch enable signal.

3. The clock gating cell as recited in claim 1 wherein internal circuitry of said clock gating cell comprises combinatorial logic that generates said gated clock signal directly from said clock signal.

4. The clock gating cell as recited in claim 2 wherein said internal circuitry further comprises combinatorial logic that generates said gated clock signal from said latch enable and said clock input signal.

5. The clock gating cell as recited in claim 3 wherein said combinatorial logic comprises an AND gate.

6. The clock gating cell as recited in claim 2 wherein said clock input signal is passed through a transparent low latch.

7. The clock gating cell as recited in claim 2 wherein said latch is a transparent low latch.

8. A method of manufacturing a clock gating cell, comprising:
   defining gate signal and clock signal inputs configured to receive gate enable and clock input signals, respectively; and
   defining a gated clock signal output configured to generate a gated clock signal that is a function of states of said gate enable and clock signals, said clock gating cell treated as an atomic entity in a cell library.

9. The method as recited in claim 8 further comprising defining internal circuitry of said clock gating cell that comprises a latch configured to receive said gate enable and clock input signals and generate therefrom a latch enable signal.

10. The method as recited in claim 8 further comprising defining internal circuitry of said clock gating cell that comprises combinatorial logic that generates said gated clock signal directly from said clock signal.

11. The method as recited in claim 9 wherein said defining said internal circuitry further comprises defining combinatorial logic that generates said gated clock signal from said latch enable and said clock input signal.

12. The method as recited in claim 10 wherein said combinatorial logic comprises an AND gate.

13. The method as recited in claim 9 wherein said clock input signal is passed through a transparent low latch.

14. The method as recited in claim 9 wherein said latch is a transparent low latch.

15. A clock gating cell, comprising:
   a latch configured to receive gate enable clock input signals and derive a latch signal therefrom; and
   combinatorial logic, coupled to said latch, configured to receive said latch and clock input signals and generate a gated clock signal therefrom, said latch and said combinatorial logic treated as an atomic entity in a cell library.

16. The clock gating cell as recited in claim 15 wherein said combinatorial logic comprises an AND gate.

17. The clock gating cell as recited in claim 15 wherein said clock input signal is passed through a transparent low latch.

18. The clock gating cell as recited in claim 15 wherein said latch is a transparent low latch.

* * * * *